US007646085B2

(12) United States Patent
Nishizawa et al.

(10) Patent No.: US 7,646,085 B2
(45) **Date of Patent: *Jan. 12, 2010**

(54) SEMICONDUCTOR DEVICE WITH POWER SOURCE FEEDING TERMINALS OF INCREASED LENGTH

(75) Inventors: Hirotaka Nishizawa, Fuchu (JP); Kenji Osawa, Hachioji (JP); Hideo Koike, Yokohama (JP); Junichiro Osako, Kodaira (JP); Tamaki Wada, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 450 days.

This patent is subject to a terminal disclaimer.

(21) Appl. No.: 10/550,278

(22) PCT Filed: Sep. 24, 2004

(86) PCT No.: PCT/JP2004/013931

§ 371 (c)(1), (2), (4) Date: Oct. 20, 2005

(87) PCT Pub. No.: WO2006/033157

PCT Pub. Date: Mar. 30, 2006

(65) Prior Publication Data

US 2007/0001279 A1 Jan. 4, 2007

(51) Int. Cl.
*H01L 23/02* (2006.01)
*H01L 23/48* (2006.01)
*H01L 21/4763* (2006.01)

(52) U.S. Cl. ....................... 257/679; 257/773; 257/783; 257/E23.141; 438/618

(58) Field of Classification Search ............ 257/E23.61, 257/E23.141, 922, 679, 786, 773; 235/492, 235/441
See application file for complete search history.

(56) References Cited

U.S. PATENT DOCUMENTS 6,056,573 A * 5/2000 Nishioka .................... 439/326

(Continued)

FOREIGN PATENT DOCUMENTS

JP 63-75977 U 5/1988
JP 03187169 A * 8/1991
JP 2000-99215 4/2000

*Primary Examiner*—Wael Fahmy
*Assistant Examiner*—Sarah K Salerno
(74) *Attorney, Agent, or Firm*—Miles & Stockbridge P.C.

(57) ABSTRACT

A semiconductor device includes external interface terminals and processing circuits, and it is fed with an operating power source when detachably set in a host equipment. Power source feeding terminals (VCC, VSS) among the external interface terminals are long enough to keep touching the corresponding terminals of the host equipment for, at least, a predetermined time period since the separation of an extraction detecting terminal among the external interface terminals, from the corresponding terminal of the host equipment, and they are formed to be longer in the extraction direction of the semiconductor device than the extraction detecting terminal. Thus, a time period till the cutoff of the power source is easily made comparatively long. The power source feeding terminals should preferably be extended onto the insertion side of the semiconductor device, but an extendible distance is sometimes liable to be limited. In order to ensure the necessary time period without changing the length and shape of the power source feeding terminals on the semiconductor device side, each of the power source feeding terminals may be formed so as to have two, front and rear touch points with the corresponding connector terminal of the host equipment side, but complicated improvements are necessitated for the construction of the connector terminal of the host equipment side. According to the semiconductor device, the time period required till the power source cutoff is easily ensured, and the complicated improvements are not required for the construction of the corresponding connector terminals of the host equipment side.

4 Claims, 15 Drawing Sheets

U.S. PATENT DOCUMENTS

| | | | | |
|---|---|---|---|---|
| 6,557,761 | B1 * | 5/2003 | Oya et al. | 235/441 |
| 6,646,885 | B1 * | 11/2003 | Yu et al. | 361/737 |
| 2001/0009505 | A1 * | 7/2001 | Nishizawa et al. | 361/737 |
| 2004/0033727 | A1 * | 2/2004 | Kao | 439/660 |
| 2004/0070952 | A1 * | 4/2004 | Higuchi et al. | 361/737 |
| 2004/0185685 | A1 * | 9/2004 | Nishizawa et al. | 439/66 |

* cited by examiner

SEMICONDUCTOR DEVICE WITH POWER SOURCE FEEDING TERMINALS OF INCREASED LENGTH

FIELD OF THE INVENTION

The present invention relates to a semiconductor device such as a memory card, or a card device represented by a multifunction card in which a microcomputer for an IC card, or the like is mounted on a nonvolatile memory chip. More particularly, it relates to techniques which are effective when applied for the elimination of any inconvenience ascribable to the cutoff of power source feed as occurs in a case where the semiconductor device is extracted from a host equipment during its operation.

BACKGROUND OF THE INVENTION

It is stated in Patent Document 1 that a detection terminal pulled down in a card device, and a terminal pulled up inside a card slot are employed for detecting the setting and extraction of the card device in and from the card slot. When the card device has been set in the card slot, the detection terminal touches the corresponding terminal of the card slot and pulls the potential of the corresponding terminal inside the card slot, to the ground. Upon detecting the ground potential, the card slot side starts the feed of an operating power source to the card device. When the card device has been extracted, the detection terminal thereof is separated from the corresponding terminal of the card slot, whereby the corresponding terminal is brought to a power source voltage. Upon detecting the power source voltage, the card slot side stops the feed of the power source to the extracted card device.

[Patent Document 1] JP-A-2000-99215 (FIG. 5)

SUMMARY OF THE INVENTION

Any inconvenience which is incurred on a card side by power source cutoff based on card extraction, is not considered in the prior-art technique. The inventor's study has revealed that, when the feed of an operating power source has been cut off to interrupt an operation while data are being rewritten in a memory card in which a flash memory is mounted, the destruction of data, the unrecoverable deteriorations of characteristics, etc. are apprehended to occur. By way of example, when the operating power source is cut off midway of an erase process preceding a write process, nonvolatile memory cells in an overerased state are sometimes left behind. Here, the "overerased state" of the nonvolatile memory cells signifies a state where the memory cell having completed, for example, an erase verify process has a threshold voltage lower than a threshold voltage distribution to-be-assumed. Even when a nonselection level is applied to the selection terminal of the nonvolatile memory cell in the overerased state, a current flows to the channel of the memory cell with this memory cell held in its ON state. When such a normally-ON nonvolatile memory cell exists, a malfunction occurs also in a read operation for the other memory cell which shares a bit line with the normally-ON cell. To cope with the drawback, a previous application (Japanese Patent Application No. 2003-89691) filed by the same assignee as in the present US application has provided a technique which is comparatively easy of eliminating the inconvenience ascribable to the power source cutoff based on the extraction of the card device. More specifically, in a card device which is fed with an operating power source when set in a card slot (card socket), the instruction of an end process within the card is given by detecting a potential change which appears in the detection terminal of the card as is separated from the predetermined terminal of the card slot, before the power source feed from the card slot side is cut off in the extraction of the card from the card slot, and the card is thus permitted to perform the end process by itself before the power source feed is completely cut off.

In the previous application, however, the viewpoint of ensuring a time period required for the end process has not been satisfactorily studied yet. The inventor took note of the relationship between the extraction detecting terminal and power source feeding terminals. Further, the inventor studied the conjoint use of a capacitor which compensates the power source feed for a certain time period after the power source cutoff. In the card device having a small size, it is also considered to use an electric double layer capacitor which is well suited to obtain a comparatively large capacitance with a comparatively small occupation area. It has been revealed, however, that the electric double layer capacitor exhibits a comparatively large internal resistance and is difficult to attain a current necessary for the process. After all, it has been revealed the best that the necessary processing time period is ensured by noting the relationship between the power source feeding terminals and the extraction detecting terminal.

An object of the present invention is to provide a semiconductor device which is comparatively easy of ensuring a processing time period for coping with power source cutoff based on extraction from a host equipment.

The above and other objects and novel features of the invention will become apparent from the description of this specification when read in conjunction with the accompanying drawings.

Typical aspects of the invention disclosed in the present application will be briefly outlined below.

[1] A semiconductor device includes external interface terminals and processing circuits, and it is fed with an operating power source when detachably set in a host equipment. The external interface terminals include power source feeding terminals, an extraction detecting terminal, and other terminals. The power source feeding terminals are long enough to keep touching the corresponding terminals of the host equipment for, at least, a predetermined time period since the separation of the extraction detecting terminal from the corresponding terminal of the host equipment, and they are formed to be longer in an extraction direction than the extraction detecting terminal.

When the power source feeding terminals are lengthened more than the extraction detecting terminal in the extraction direction in this manner, a time period till the cutoff of the power source can be easily made comparatively long. In order to prevent the arrangement of the connector terminals of the host equipment side from being changed, the power source feeding terminals should preferably be extended in a direction in which the semiconductor device is inserted into the host equipment. However, the distance of the extension is liable to be limited, and the necessary processing time period cannot be sometimes ensured. Besides, in order to ensure the necessary processing time period without changing the length and shape of the power source feeding terminals on the semiconductor device side, substantially the same effect as in the case of enlarging the length of the power source feeding terminals can be attained by forming each of the power source feeding terminals so as to have two, front and rear touch points with the corresponding connector terminal of the host equipment side. However, complicated improvements are necessitated for the construction of the connector terminal of the host equipment side. According to the expedient specified above, the time period required till the power source cutoff is easily ensured, and the complicated improvements are not required for the construction of the corresponding connector terminals of the host equipment side.

In a practicable aspect of the invention, the power source feeding terminals are made longer than the extraction detecting terminal, also on a side opposite to the extraction direction, and a length which the power source feeding terminals protrude on the opposite side to the extraction direction, beyond the extraction detecting terminal, is smaller than a length which the power source feeding terminals protrude in the extraction direction. This aspect is effective in a case where the power source feeding terminals are to be made longer even slightly.

In another practicable aspect of the invention, when set in the host equipment, each of the power source feeding terminals touches the corresponding terminal of the host equipment at two positions along the extraction direction. This aspect increases the number of power feed points in the state of the setting of the semiconductor device in the host equipment, and is excellent for stabilizing the power source feed.

[2] A semiconductor device based on another viewpoint of the invention includes external interface terminals and processing circuits, and it is fed with an operating power source when detachably set in a host equipment. The external interface terminals include power source feeding terminals, an extraction detecting terminal, and other terminals. The power source feeding terminals are long enough to touch the corresponding terminals of the host equipment for, at least, 1.0 millisecond since the separation of the extraction detecting terminal from the corresponding terminal of the host equipment, with respect to an extraction speed of 2.5 meters/second. The inventor's study has revealed that the speed at which the semiconductor device is extracted from the host equipment may be satisfactorily supposed to be 2.5 meters/second as the highest speed. This value has taken into consideration, a speed in the case where, in a state in which the semiconductor device has been further pushed into a card socket of push-push type against the elastic forces of springs, it is directly protruded out. On this occasion, a processing time period required till the cutoff of the power source has been estimated to be one millisecond. There has been considered, for example, a voltage application processing time period which is required for shifting the threshold voltage of an overerased nonvolatile memory cell into a normal-erase threshold voltage distribution. A touch length derived from such a relationship is ensured, whereby the processing time period required till the power source cutoff can be ensured.

In a practicable aspect of the invention, the power source feeding terminals are preferably formed so as to be longer than the extraction detecting terminal in the extraction direction of the semiconductor device. As in the foregoing, this aspect attains the advantages that a time period required till the cutoff of the power source is easily ensured, and that complicated improvements are not required for the construction of the connector terminals of the host equipment side.

In a further practicable aspect of the invention, the power source feeding terminals may well be made longer than the extraction detecting terminal, also on a side opposite to the extraction direction. On this occasion, however, a length which the power source feeding terminals protrude on the opposite side to the extraction direction, beyond the extraction detecting terminal, is smaller than a length which the power source feeding terminals protrude in the extraction direction.

In a further practicable aspect of the invention, each of the power source feeding terminals may well touch the corresponding terminal of the host equipment at two positions along the extraction direction, when it has been set in the host equipment.

In a further practicable aspect of the invention, the semiconductor device may well have notches which are disengageably engaged with the elastic members of the host equipment.

[3] A semiconductor device based on still another viewpoint of the invention includes external interface terminals and processing circuits, and it is fed with an operating power source when detachably set in a host equipment. The external interface terminals are arranged in two rows in a direction crossing the extraction direction of the semiconductor device. They include power source feeding terminals, an extraction detecting terminal, and other terminals, and the power source feeding terminals are long so as to extend from the first row over to the second row.

Thus, in case of a semiconductor device which originally includes two rows of external interface terminals, a time period till the cutoff of the power source is easily made comparatively long by forming the power source feeding terminals so as to extend from the first row over to the second row. Moreover, in the case where the semiconductor device includes the two terminal rows, the connector terminals of the card socket of the host equipment are originally in, at least, two rows, so that two of the connector terminals can stably touch the power source feeding terminals, and the stabilization of the power source feed can be easily coped with.

Advantages which are attained by typical aspects of the invention disclosed in the present application, are as briefly described below.

It becomes comparatively easy to ensure a processing time period for coping with the cutoff of a power source attributed to the extraction of a semiconductor device from a host equipment.

DETAILED DESCRIPTION OF THE PREFERRED EMBODIMENTS

<<Memory Card>>

Figure 1:
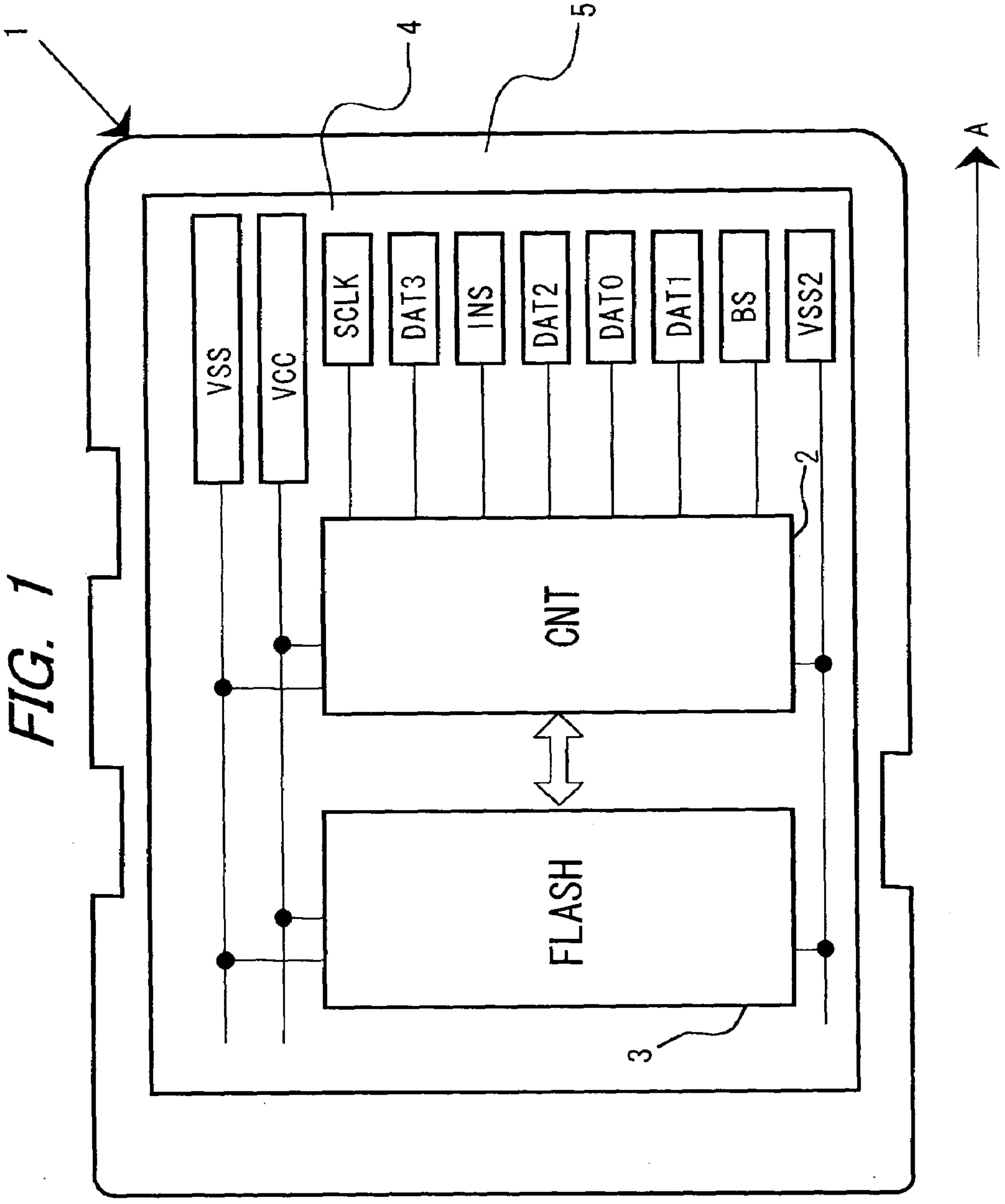
FIG. 1 is a schematic plan view showing a memory card according to an example of the present invention.

Shown in FIG. 1 is a memory card according to an example of the present invention. The memory card 1 includes a card substrate 4 on which an interface control circuit (CNT) 2 and a flash memory (FLASH) 3 are mounted. The mounting surface of the card substrate 4 is covered with a casing 5, and external interface terminals are constructed so as to be exposed to the surface of the card substrate 4 opposite to the mounting surface. In the figure, wiring lines on the interface control circuit 2 as well as the flash memory 3 and the card substrate 4 are schematically shown.

The external interface terminals shown in FIG. 1 include a ground terminal VSS, a power source terminal VCC, a second ground terminal VSS2, a serial clock input terminal SCLK, an insertion/extraction detection terminal INS, a bus status terminal BS, and data terminals DAT0-DAT3. The ground terminal VSS, power source terminal VCC, and second ground terminal VSS2 are connected to the interface control circuit 2 as well as the flash memory 3, and they are used for feeding an operating power source. The serial clock input terminal SCLK, insertion/extraction detection terminal INS, bus status terminal BS, and data terminals DAT0-DAT3 are connected to the interface control circuit 2. When the memory card 1 is detachably set in the card slot of a host equipment not shown, the external interface terminals touch the connector terminals of the card slot, thereby to establish electrical connections with the host equipment. Thus, a power source is fed from the host equipment to the memory card 1 through the ground terminal VSS, power source terminal VCC and second ground terminal VSS2. When the memory card 1 is fed with the operating power source, it has its power-ON reset. After the power-ON reset, the interface control circuit 2 performs an interface control conforming to a predetermined interface protocol, between this control circuit 2 and the host equipment, and it subjects the flash memory 3 to a memory interface control for file memory access. By the way, in an operation mode which does not use the data terminals DAT1-DAT3, the data terminal DAT0 functions as a serial data input/output terminal (SDIO).

The flash memory 3 includes a memory mat in which a large number of nonvolatile memory cells being electrically erasable and programmable are arranged in the shape of a matrix. Although not especially restricted, each of the nonvolatile memory cells has a stacked gate structure which includes a source (source line connection), a drain (bit line connection), a channel, and a floating gate and a control gate (word line connection) stacked on the channel in a manner to be insulated from each other. By way of example, an erase process is performed in such a way that a negative high voltage is applied to a word line so as to extract electrons from the floating gate into a well region, and a write process is performed in such a way that a positive high voltage is applied as a word line voltage so as to inject hot carriers from the drain region into the floating gate. Later threshold voltages as viewed from the control gate differ between in the erase process and the write process, and information is stored owing to the difference. The drain electrode of the nonvolatile memory cell is connected to a corresponding bit line, and the source electrode thereof to a corresponding source line. In a data read operation or verify operation, a selection level is bestowed through the word line on the control gate of one of the nonvolatile memory cells sharing the bit line, and a nonselection level is bestowed through the word line on the control gate of the other of the nonvolatile memory cells sharing the bit line, whereby the logical value of read data is determined in accordance with cases where the threshold voltage of the nonvolatile memory cell endowed with the selection level is lower than the selection level, and where it is higher. On this occasion, when even either of the nonvolatile memory cells sharing the bit line is a normally-ON nonvolatile memory cell, the normal read operation cannot be performed. The "normally-ON nonvolatile memory cell" is a nonvolatile memory cell whose threshold voltage is lower than the nonselection level, that is, a nonvolatile memory cell which is in an overerased state.

The interface control circuit 2 subjects the flash memory 3 to access controls as a file memory compatible with a hard disk. By way of example, the interface control circuit 2 manages the addresses of the flash memory 3 in a manner to be accessible to the data area thereof in sector units, and it performs the allocation control of substitute sectors for defective sectors. In accesses to the flash memory 3, the interface control circuit 2 performs the access controls of the erase process, write process and read process by using the physical addresses.

<<Power Source Feeding Terminals>>

Although not especially restricted, the external interface terminals are shaped by the etching of conductive patterns on the card substrate 4. The second ground terminal VSS2, serial clock input terminal SCLK, insertion/extraction detection terminal INS, bus status terminal BS, and data terminals DAT0-DAT3 have equal sizes, respectively, and they are arrayed at equal intervals in a row. In FIG. 1, an A-direction is an insertion direction in the case where the memory card 1 is set in the host equipment. The ground terminal VSS and the power source terminal VCC are formed to be longer in a direction opposite to the insertion direction A.

Figure 2:
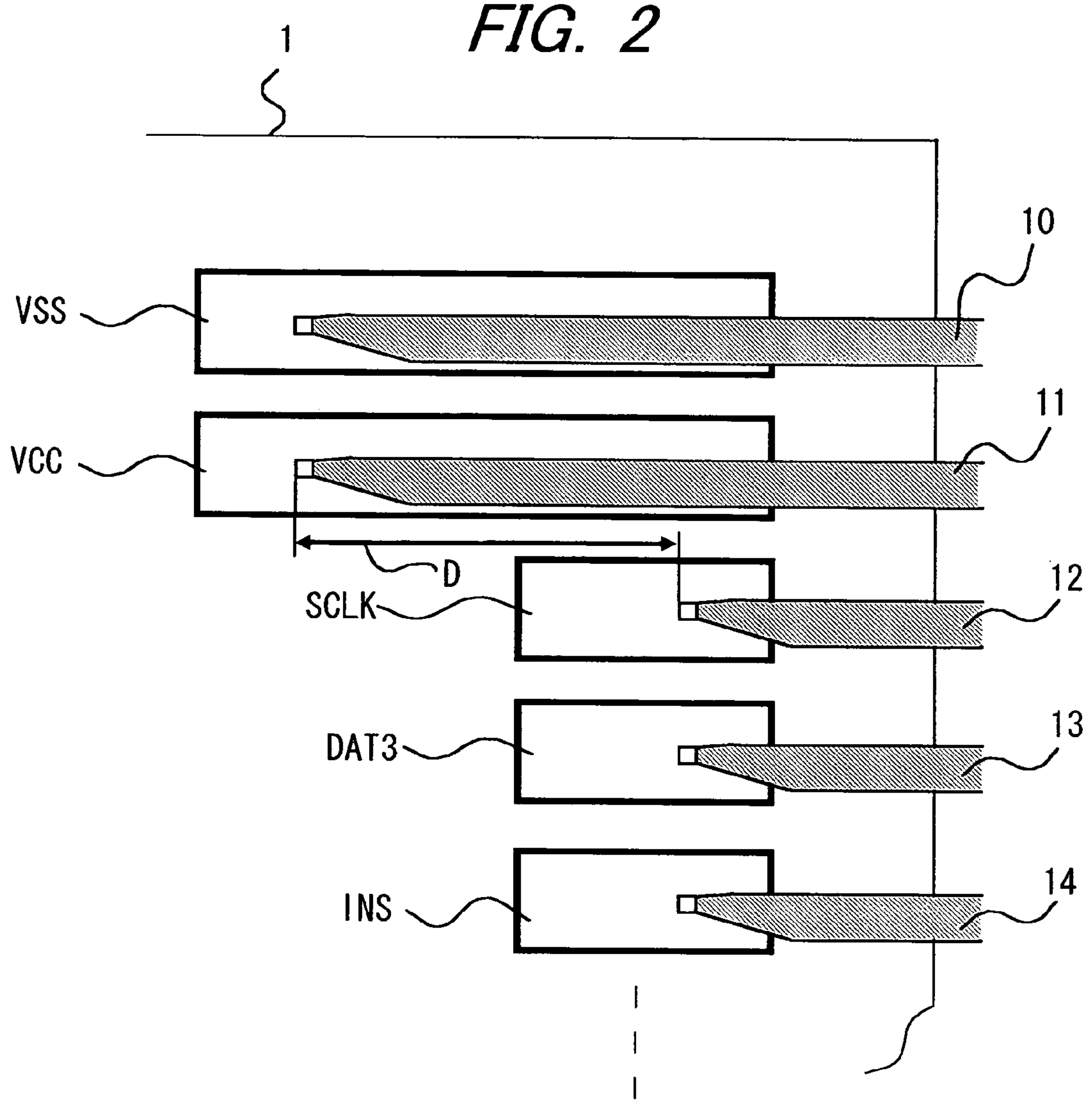
FIG. 2 is a plan view showing an example of the connections between the external interface terminals of the memory card and the connector terminals of a card slot, in a setting completion state.

Exemplified in FIG. 2 is the relationship between the external interface terminals of the memory card 1 and the connector terminals of the card slot. Numeral 11 designates the connector terminal corresponding to the power source terminal VCC, and numeral 10 the connector terminal corresponding to the ground terminal VSS. Numerals 12-14 designate the connector terminals corresponding to the serial clock input terminal SCLK, data terminal DAT3 and insertion/extraction detection terminal INS which represent the other external interface terminals. The touch points of the respective connector terminals 10-14 with the external interface terminals become the distal end parts thereof. The touch points between the power source feeding connector terminals 10, 11 and the power source feeding terminals VCC, VSS are spaced a distance D in the opposite direction to the insertion direction A, relative to the touch points of the connector terminals 12-14 corresponding to the other external interface terminals. In inserting the memory card 1, accordingly, the power source feeding terminals VCC, VSS are respectively connected with the corresponding connector terminals earlier than the other external interface terminals by a touching time period corresponding to the distance D. In extracting the memory card 1, the power source feeding terminals VCC, VSS are respectively separated from the corresponding connector terminals later than the other external interface terminals by the touching time period corresponding to the distance D. That is to say, the cutoff of the power source can be delayed by the touching time period corresponding to the distance D, after the other external interface terminals have been separated from the connector terminals of the card socket.

When, as stated above, the ground terminal VSS and the power source terminal VCC are formed to be long in the opposite direction to the insertion direction A, a time period till the cutoff of the power source can be easily made comparatively long. In contrast, the ground terminal VSS and the power source terminal VCC should favorably be extended in the insertion direction (A-direction) in order that the arrangement of the connector terminals on the side of the host equipment may remain unchanged. On this occasion, however, the distance of the extension is susceptible to limitation, and it is sometimes impossible to ensure a necessary processing time period. Besides, in order to cope with the delay of the power source cutoff without changing the length and shape of each of the power source feeding terminals of the memory card 1, each of these terminals may have two, front and rear touch points with the corresponding connector terminal 10 or 11 on the host equipment side, whereby substantially the same effect as in the case of lengthening each power source feeding terminal can be attained. On this occasion, however, the construction of each of the connector terminals 10 and 11 on the host equipment side requires complicated improvements. After all, when the ground terminal VSS and the power source terminal VCC are formed to be long in the opposite direction to the insertion direction A of the memory card 1, the time period required till the power source cutoff can be easily ensured, and the complicated improvements are not required for the construction of each of the connector terminals 10 and 11 on the host equipment side.

Figure 3:
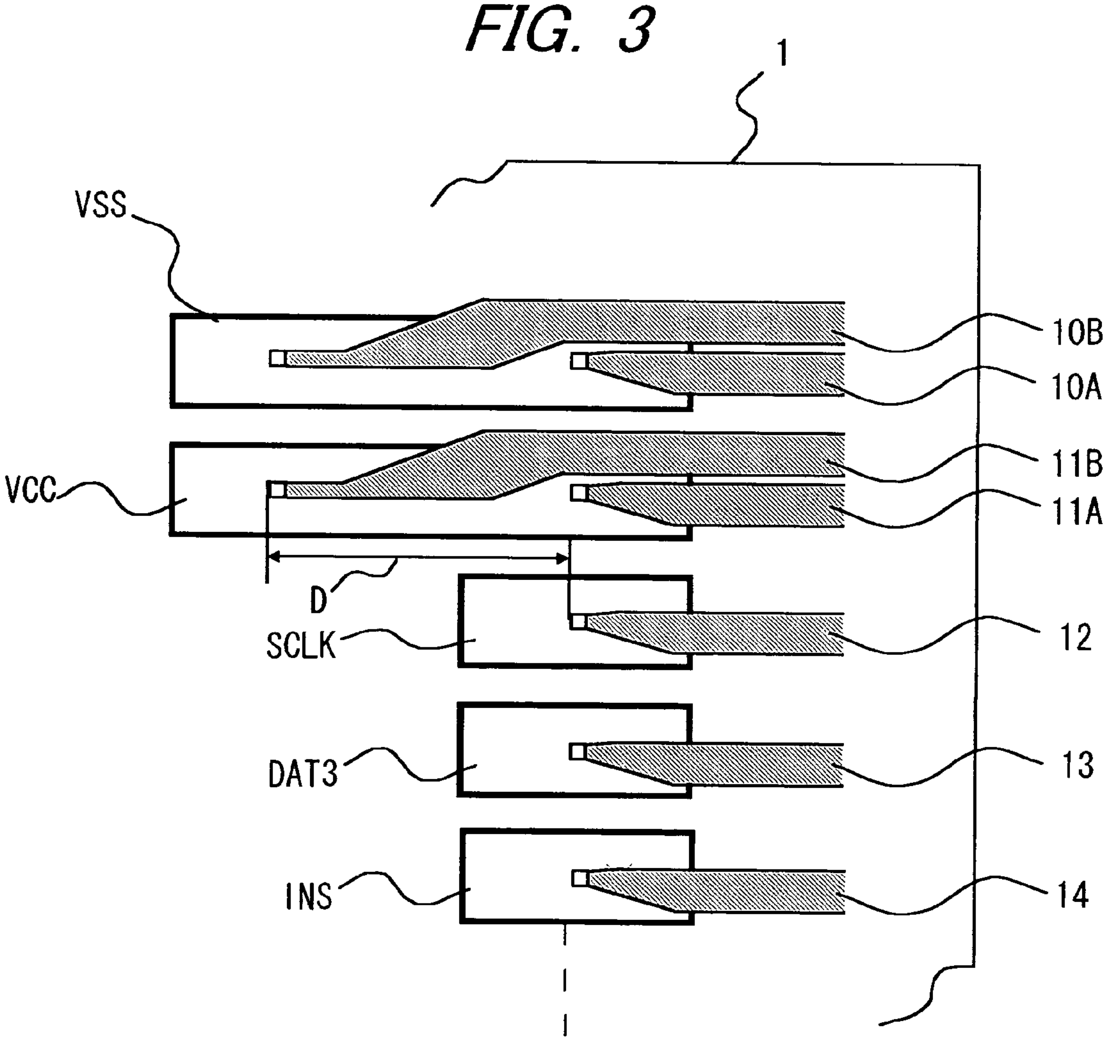
FIG. 3 is a plan view showing another example of the connections between the external interface terminals of the memory card and the connector terminals of the card slot, in the setting completion state.

Shown in FIG. 3 is another example of the external interface terminals of the memory card 1 and the connector terminals of the card slot. Two connector terminals 10A, 10B corresponding to the ground terminal VSS are disposed with their distal ends shifted, while two connector terminals 11A, 11B corresponding to the power source terminal VCC are similarly disposed with their distal ends shifted. The distal ends of the shorter connector terminals 10A, 11A are located at the same positions as those of the distal ends of the other connector terminals in the card insertion direction, and the distal ends of the longer connector terminals 10B, 11B are spaced from those of the shorter connector terminals 10A, 11A by the distance D in the card insertion direction. Also in this case, in the same manner as in FIG. 2, in inserting the memory card 1, the power source feeding terminals VCC, VSS are respectively connected with the corresponding connector terminals earlier than the other interface terminals by the touching time period corresponding to the distance D. In extracting the card 1, the power source feeding terminals VCC, VSS are respectively separated from the corresponding connector terminals later than the other interface terminals by the touching time period corresponding to the distance D. In particular, each of the power source and ground terminals is provided with the two power source feeding points (the connection points between each power source feeding terminal and the corresponding connector terminal), so that the stability of the feed of the power source after the setting of the memory card 1 can be enhanced.

Figure 4:
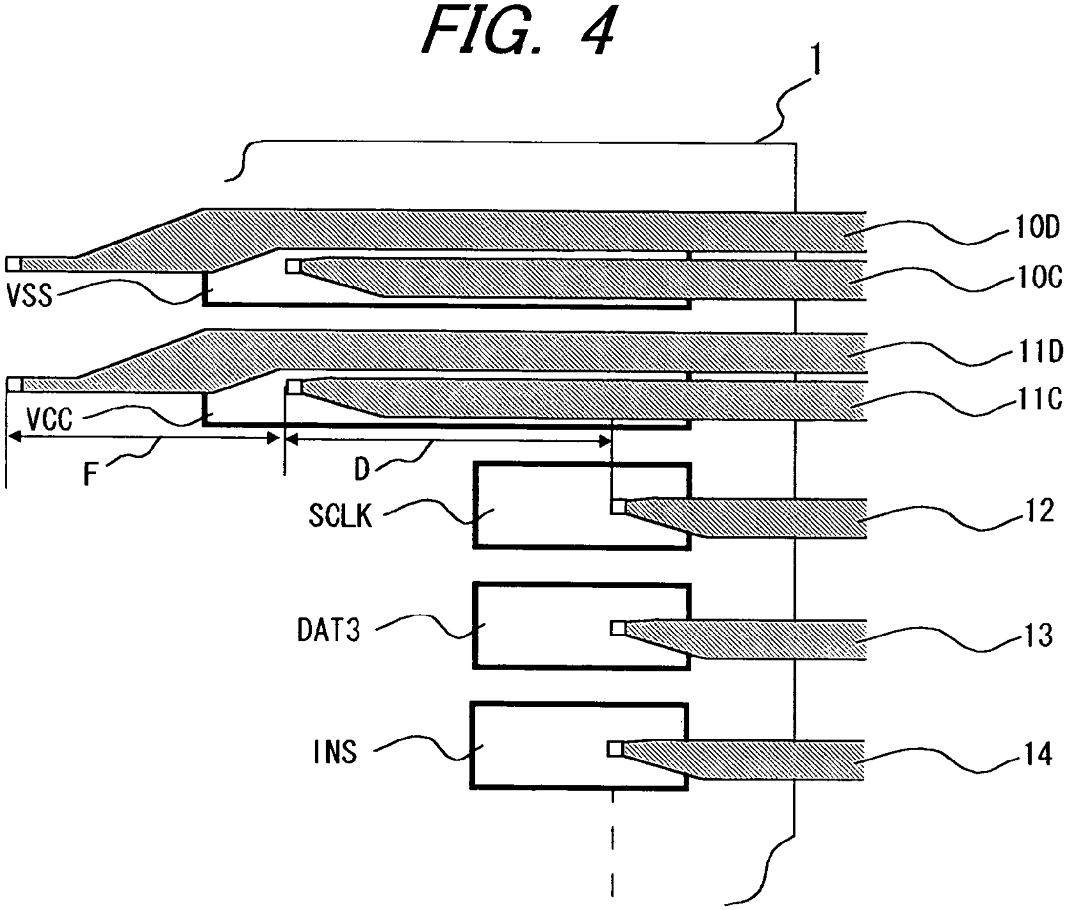
FIG. 4 is a plan view showing still another example of the connections between the external interface terminals of the memory card and the connector terminals of the card slot, in the setting completion state.

Shown in FIG. 4 is still another example of the external interface terminals of the memory card 1 and the connector terminals of the card slot. It is the same as in FIG. 3 that two connector terminals 11C, 11D corresponding to the power source terminal VCC are disposed with their distal ends shifted, while two connector terminals 10C, 10D corresponding to the ground terminal VSS are similarly disposed with their distal ends shifted. However, the distal end of each of the shorter connector terminals 10C, 11C is spaced from the distal ends of the other connector terminals by the distance D in the card insertion direction, and the distal end of each of the longer connector terminals 10D, 11D is further spaced from the distal ends of the shorter connector terminals 10C, 11C by a distance F in the card insertion direction. Thus, in inserting the memory card 1, the power source feeding terminals VCC, VSS are respectively connected with the corresponding connector terminals earlier than the other external interface terminals by a touching time period corresponding to a distance (D+F). In extracting the card 1, the power source feeding terminals VCC, VSS are respectively separated from the corresponding connector terminals later than the other interface terminals by the touching time period corresponding to the distance (D+F). That is to say, the cutoff of the power source can be delayed by the touching time period corresponding to the distance (D+F), after the other interface terminals have been separated from the connector terminals of the card socket. In a state where the setting of the memory card 1 in the card socket has been completed, each of the power source and ground terminals VCC, VSS has only one feeding point of the power source, but the difference of the touching time periods can be enlarged in correspondence with the distance (D+F).

The time period difference can be attained in inserting/extracting the card, by lengthening the power source feeding terminals 10, 11. In setting the card, the power-ON reset of the memory card 1 is effected earlier owing to the time period difference, and in extracting the card, an end process for ending a midway process is performed before the power source cutoff since the detection of the insertion/extraction earlier by the time period difference. The details of the end process will be described later. Especially in the invention, the length of the power source feeding terminals 10, 11 is determined in consideration of a time period difference which is required for the end process. The inventor's study has revealed that a speed at which the memory card 1 is extracted from the host equipment may be satisfactorily supposed to be 2.5 meters/second as the highest speed. This value has taken into consideration a speed in the case where, in a state in which a semiconductor device has been further pushed into a card socket of push-push type against the elastic forces of springs, the semiconductor device is directly protruded out. On this occasion, one millisecond has been estimated as a processing time period which is required till the power source cutoff. There has been considered, for example, a voltage application processing time period which is required for shifting the threshold voltage of an overerased nonvolatile memory cell into a normal-erase threshold voltage distribution. A touch length derived from such a relationship is ensured, whereby the processing time period required till the power source cutoff can be ensured. More specifically, each of the power source feeding terminals has a length with which it can touch the corresponding terminal of the host equipment for, at least, 1.0 millisecond with respect to the extraction speed of 2.5 meters/second, after the extraction detecting terminal INS has been separated from the corresponding terminal of the host equipment. By way of example, assuming that the extraction speed is 2.5 meters/second and that the processing time period required till the power source cutoff is one millisecond, the distance D in each of FIGS. 2 and 3 is set at 2.5 millimeters, and the distance (D+F) in FIG. 4 is set at 2.5 millimeters.

Figure 5:
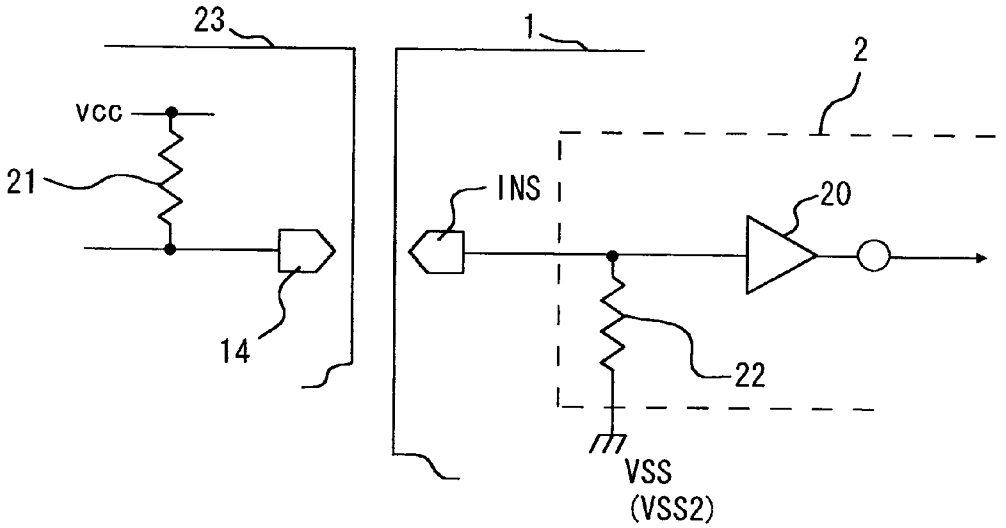
FIG. 5 is a circuit diagram exemplifying a circuit arrangement for performing insertion/extraction detection by voltage detection.

Exemplified in FIG. 5 is a circuit arrangement for insertion/extraction detection. The connector terminal 14 of the card slot as corresponds to the insertion/extraction detection terminal INS is pulled up through a resistor 21 inside the host equipment 23. Inside the memory card 1, the insertion/extraction detection terminal INS is connected to the ground terminals VSS, VSS2 through a resistor 22. In order to permit the detection of the extraction from the card slot by the memory card 1 itself, the input of an amplifier 20, for example, is connected to the insertion/extraction detection terminal INS so as to decide the extraction by the output of the amplifier 20. The connector terminal 14 is pulled up to a power source voltage vcc in a floating state. When the memory card 1 has been inserted to bring the insertion/extraction detection terminal INS into touch with the connector terminal 14, this connector terminal 14 is brought to a low level which is determined by the voltage division ratio between the resistors 21 and 22. The host equipment 23 detects the low level, whereby the setting of the memory card 1 is recognized. The amplifier 20 has a level intermediate between the low level and a ground level vss, as its input threshold voltage. Accordingly, the amplifier 20 outputs the low level when its input voltage is lower than the input threshold voltage, and it outputs a high level when not. When the insertion/extraction detection terminal INS has been separated from the connector terminal 14 by the extraction of the memory card 1, the input of the amplifier 20 falls into the ground voltage vss of circuitry, and the interface control circuit 2 can recognize the extraction of the memory card 1 owing to the output inversion of the amplifier 20.

Figure 6:
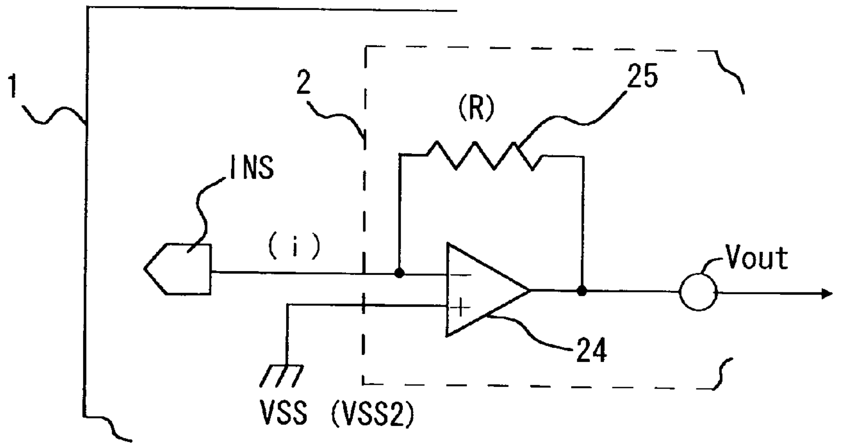
FIG. 6 is a circuit diagram exemplifying a circuit arrangement for performing the insertion/extraction detection by current detection.

Exemplified in FIG. 6 is another circuit arrangement for the insertion/extraction detection. The connector terminal of the card slot as corresponds to the insertion/extraction detection terminal INS is pulled up through a resistor 21 inside the host equipment, in the same manner as in FIG. 5. Inside the memory card 1, the insertion/extraction detection terminal INS is connected to the inverting input terminal (−) of a differential amplifier 24. The output terminal of the differential amplifier 24 is feedback-connected to the inverting input terminal (−) through a resistor 25. The ground terminals VSS, VSS2 are connected to the noninverting input terminal (+) of the differential amplifier 24. Letting "i" denote a current fed to the inverting input terminal (−), and "R" denote the resistance of the negative feedback resistor 25, the output voltage Vout of the negative feedback differential amplifier 24 becomes $Vout=-i\cdot R$. The presence or absence of the current i which is fed to the insertion/extraction detection terminal INS can be detected by the negative feedback differential amplifier 24, whereby the touch/separation between the connector terminal of the host equipment and the insertion/extraction detection terminal INS of the memory card 1 becomes detectable.

Figure 7:
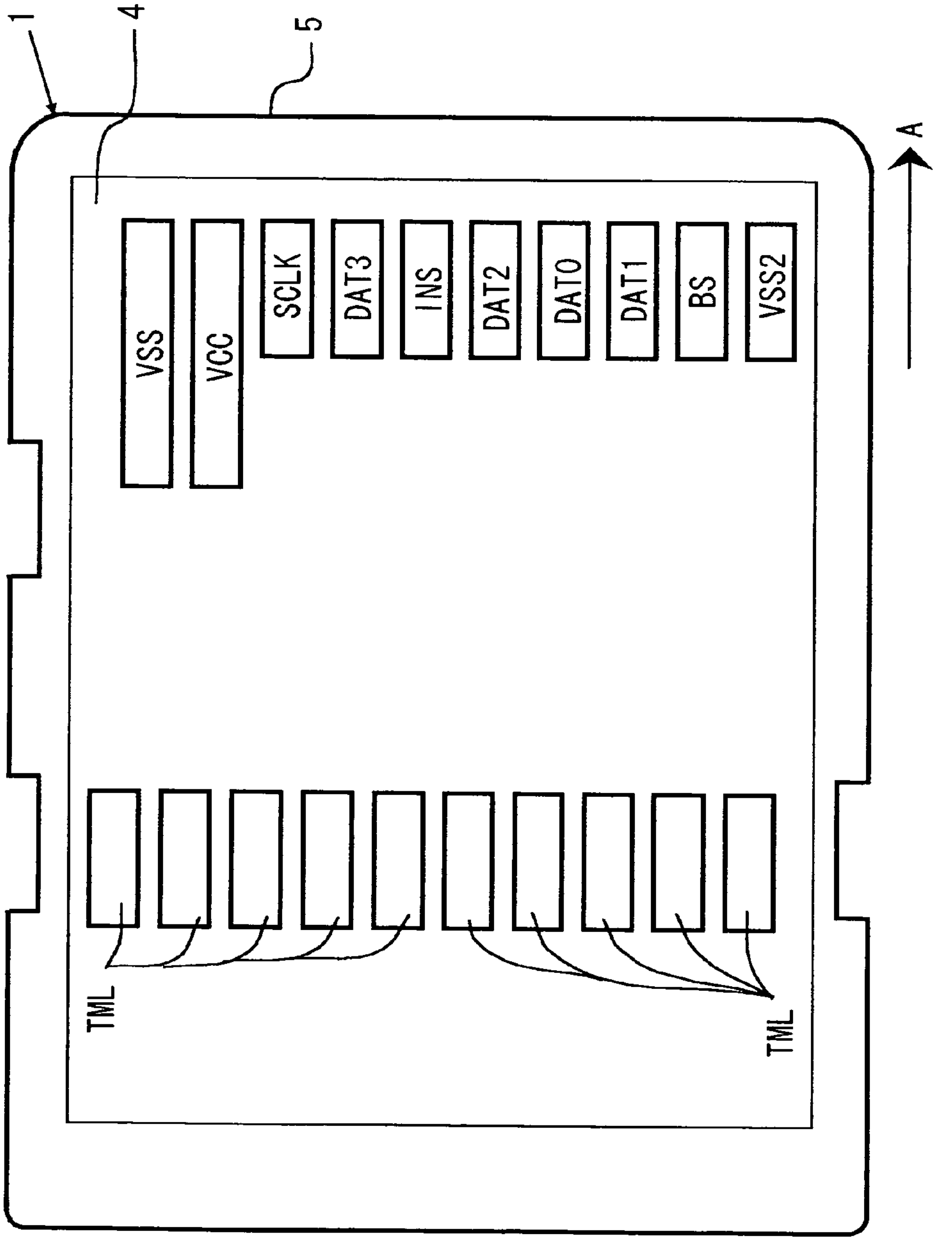
FIG. 7 is a plan view showing an example in which the external interface terminals are arranged in two rows.

Shown in FIG. 7 is an example in which the external interface terminals are arranged in two rows. Signs TML denote the external interface terminals of the second row. The external interface terminals TML are used as, for example, data terminals added in case of increasing the number of parallel data input/output bits, or interface terminals in the case where an IC card microcomputer for security is mounted on the memory card 1. The external interface terminals of the first row are the same as in FIG. 1.

Figure 8:
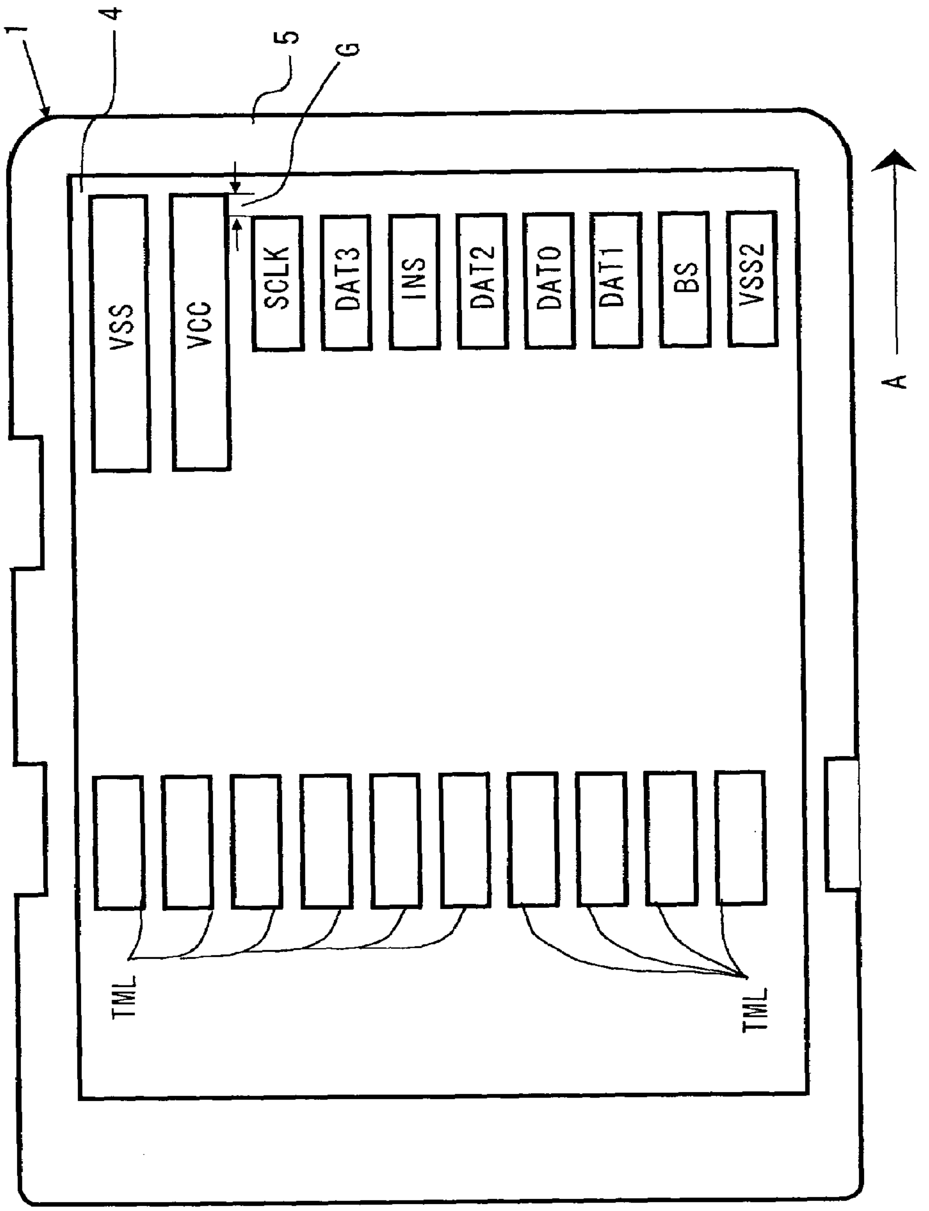
FIG. 8 is a plan view showing another example in which the external interface terminals are arranged in two rows.

Shown in FIG. 8 is another example in which the external interface terminals are arranged in two rows. The point of difference of this example from the example in FIG. 7 lies in the arrangement of the power source feeding terminals of the first row. As understood by comparing FIG. 8 with FIG. 1 or 7, the power source feeding terminals VSS, VCC are arranged so as to shift a distance G in the card insertion direction. The reason therefor is that the intervening wiring space between the first and second rows becomes smaller disadvantageously due to the addition of the external interface terminals TML of the second row, so this space is intended to enlarge even slightly. Besides, as understood by comparing FIG. 8 with FIG. 7, the power source feeding terminals VSS, VCC are thickened relative to the other external interface terminals. In this way, when each of the connector terminals corresponding to the power source feeding terminals is to have the two contacts or touch points, the manufacture of the connector terminals can be facilitated.

Figure 9:
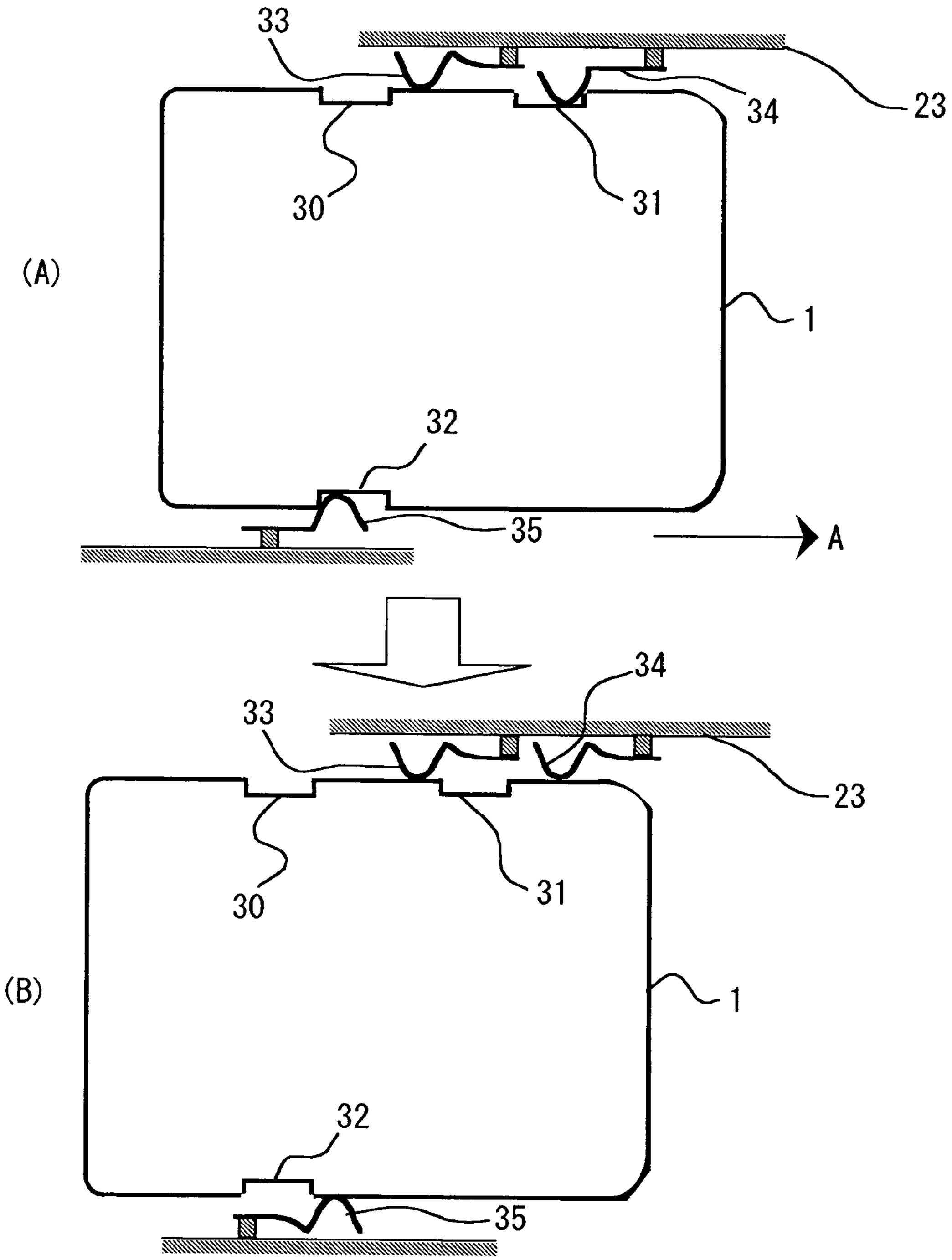
FIG. 9 is a schematic plan view exemplifying a jumpout suppression mechanism for the memory card.

Exemplified in FIG. 9 is a jumpout suppression mechanism for the memory card 1. Notches 30-32 are formed in both the side surfaces of the memory card 1. Leaf springs 33-35 which come into elastic touch with the side surfaces of the memory card 1 are supported in cantilever fashion inside the card slot 23 of the host equipment. In a state (shown at (A)) where the memory card 1 has been completely set in the card slot 23, the leaf springs 34, 35 enter the respectively corresponding notches 31, 32, thereby to position the memory card 1. The leaf spring 33 exerts a pressing force on the side surface of the memory card 1. The card slot 23 has, for example, the construction of a so-called "push-push configuration" which allows the card 1 to be set therein or detached therefrom by a push-in manipulation. More specifically, the springs are compressed by the displacement of the memory card inserted against the pressing forces of the springs, so as to latch the memory card by toggle latches, and the memory card is thereafter pushed in slightly, whereby the latch of the memory card by the toggle latches is released, and the memory card is urged in an ejection direction by the elastic forces of the springs. In a state (shown at (B)) immediately after the memory card 1 has been pushed slightly in the insertion direction A in the set state shown at (A) in FIG. 9, so as to exert urging forces of the ejection direction on the memory card 1, the three leaf springs 33-35 lie in elastic touch with the side surfaces of the memory card 1 and exert slide resistances on these side surfaces, so that the violet jumpout of the memory card 1 is suppressed. The suppression contributes to lowering the highest speed of the extraction of the memory card 1 from the host equipment. In a case where a comparatively long time is required as the time period of the end process, the suppression functions to shorten the distance D or (D+F).

<<End Process>>

The end process in the extraction of the memory card 1 will be described. This end process is a process (also termed "write-up process") which uniformalizes the threshold voltages of the nonvolatile memory cells midway of, for example, the erase and erase verify processes, into a predetermined threshold voltage distribution. Here, the instruction of the write-up process for the flash memory 3 is given by a reset signal (not shown). That is, the flash memory 3 performs the write-up process when the reset signal is asserted midway of the erase and erase verify processes. Assuming by way of example that the erase process is performed for the nonvolatile memory cells in word line units inside the flash memory 3, the write-up process is a process which writes information lightly into the nonvolatile memory cells being subjects for the erase process. The "light write" is a write process in which a write high-voltage application time period is shorter than in the ordinary write process, and in which, among the memory cells to-be-erased, ones exhibiting negative threshold voltages have their threshold voltages heightened to positive voltages. In a case where a write voltage is applied to a word line in the erase process proceeding in word line units, a potential difference which is applied to a charge accumulation layer for accumulating charges becomes greater in the memory cell whose threshold voltage is the negative voltage, than in the memory cell whose threshold voltage is the positive voltage. Therefore, information is written earlier into the memory cell whose threshold voltage is the negative voltage. The write-up process is intended to bring into the positive voltage, the threshold voltages of the memory cells which are in the overerased state, especially whose threshold voltages are the negative voltages, so that the application time period of the write voltage may be shorter than in the ordinary write process. Thus, even when the power source has been undesirably cut off midway of the write of data before the complete cutoff of the power source feed, the memory card 1 can perform the process by itself so that the memory cells in the overerased state may not remain. In order to shorten the time period of the write-up process, the application voltage may be heightened within a possible range.

Another end process is a process which completes the storage of information into a management area necessary for the recognition of a storage area. An FAT (file allocation table) or a sector management area in a file memory must be guaranteed to be readable upon the closure of the power source. The sector management area, for example, stores therein the correspondence between logical addresses (sector addresses) and memory addresses, the validities of sectors, substitute addresses for defective sectors, and so forth. When the storage of information into the FAT or the sector management area concerning the sectors to-be-rewritten has been completed as the end process, it is possible to suppress a situation where the process is interrupted with the data of such an area being incomplete, so that the recognition of the storage area such as the sectors becomes impossible. Supposing by way of example a case where the sector management area of the sectors to-be-erased is also erased together with the sector erase, the recognition of the sectors is anticipated to become completely impossible, without performing the end process. Also the instruction of the end process may be given as a reset signal for the flash memory 3. When the erase process or write process is proceeding at the assertion of the reset signal, the end process may be performed for completing the storage of the information into the FAT or the sector management area.

Still another end process is a process which completes the midway storage of information after the initialization process of threshold voltages. By way of example, when the erase process or write process is proceeding at the assertion of a reset signal, the write process for a sector midway of write is completed, and management information, which indicates that the sector is valid, is set in the corresponding sector management area. The write process instructed by the host side can be completed after erase, so that a write retry or the like process need not be performed upon the re-closure of the power source.

<<Capacitor-free>>

As described above, when the power source feeding terminals VCC, VSS are lengthened more than the extraction detecting terminal INS in the extraction direction, the time period till the power source cutoff is easily made comparatively long. Accordingly, a power source compensating capacitor need not be mounted between the power source wiring line connected to the power source terminal VCC and the ground wiring line connected to the ground terminal VSS, in order to compensate the operating power source in the case of the power source cutoff during the midway process. Consequently, a space for mounting the power source compensating capacitor is not required. It is unnecessary to daringly adopt an electric double layer capacitor which is inappropriate for deriving a comparatively large current, though which can really afford a comparatively large capacitance with a small size.

Figure 10:
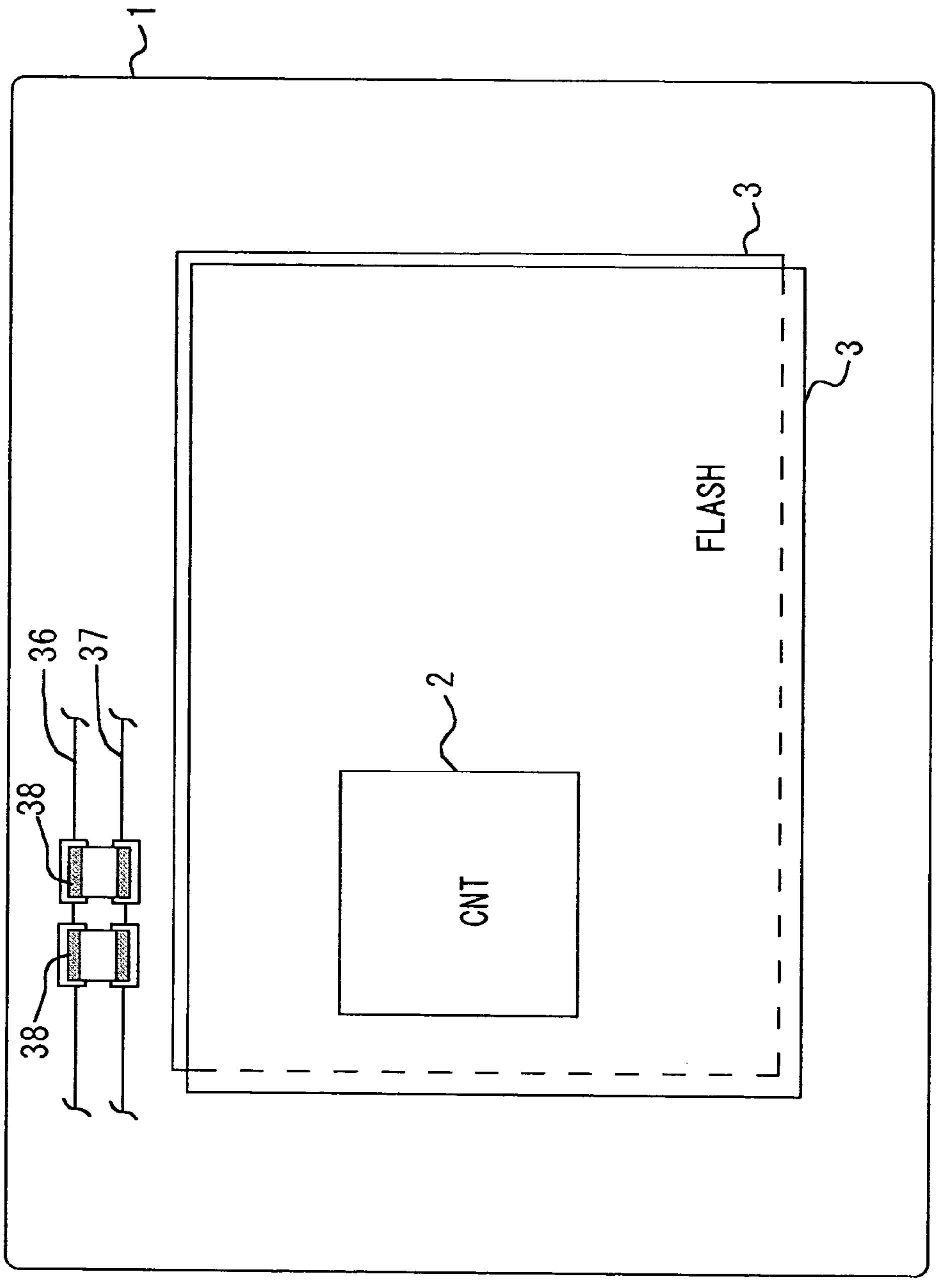
FIG. 10 is a plan view exemplifying the circuit component mounting surface of the memory card.

Shown in FIG. 10 is the circuit component mounting surface of the memory card 1. The power source wiring line 36 and the ground wiring line 37 are representatively shown as the wiring lines. As stated before, any power source compensating capacitor is not connected between the power source wiring line 36 and the ground wiring line 37. In this example, two decoupling capacitors 38 which have a chattering reduction function are respectively connected between the power source wiring line 36 and the ground wiring line 37. Since a capacitance necessary for each of the decoupling capacitors 38 is small, no areal burden is imposed by mounting the decoupling capacitors 38.

<<Multifunction Memory Card>>

Figure 11:
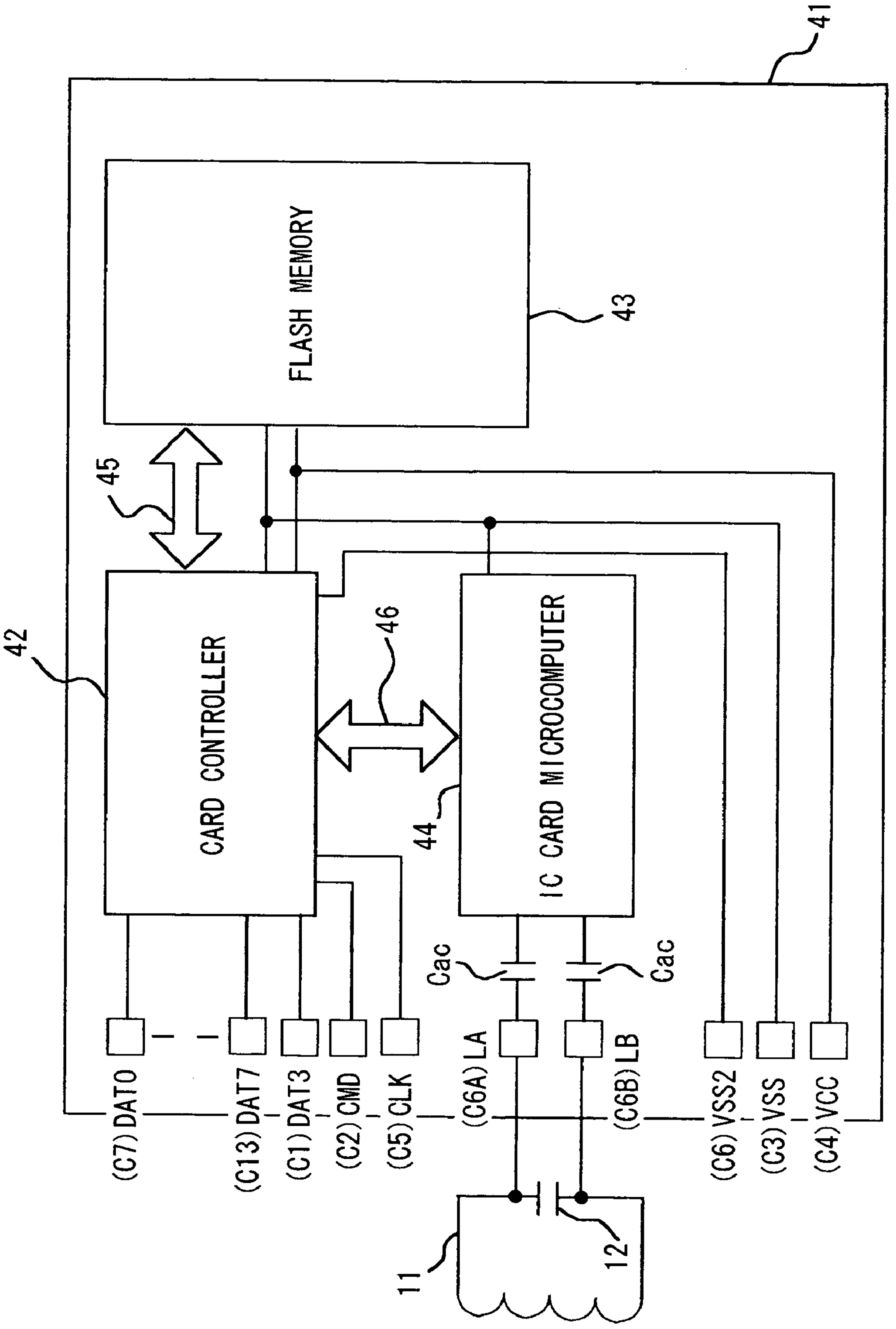
FIG. 11 is a block diagram of a memory card having multifunctions, according to the second example of the invention.

Exemplified in FIG. 11 is a block diagram of a memory card having multifunctions, according to the second example of the invention. The memory card 41 shown in the figure offers the multifunctions, for example, an information storage function, and a security function which accompanies encrypt/decrypt processes, a verify process, etc. The security function is utilized for, for example, payment by a credit card and accounting in transport facilities.

The memory card 41 is such that, on a wiring substrate which is formed with a plurality of external terminals, there are mounted a card controller 42, a nonvolatile storage device, for example, flash memory 43 which is electrically rewritable and which is connected to the card controller 42 by internal buses 45, and an IC (integrated circuit) card microcomputer (a microcomputer for an IC card) 44 which is a security controller and which is connected to the card controller 42 by internal buses 46. Although not especially restricted, the card controller 42, flash memory 43 and IC card microcomputer 44 are respectively constructed of individual semiconductor integrated circuit chips.

The card controller 42 has the external interface functions of the memory card conforming to, for example, multimedia card standards, the memory interface function of accessing the flash memory as a file memory in accordance with the specifications thereof, and the IC card microcomputer interface function of interfacing with the IC card microcomputer by using memory card commands, etc.

The flash memory 43 includes electrically erasable and programmable nonvolatile memory cells though they are not especially shown. Each of the nonvolatile memory cells has a so-called "stacked gate structure" which includes a floating gate, or a so-called "split gate structure" which is configured of a memory transistor portion and a selection transistor portion and which includes an ONO (oxide-nitride-oxide) gate-insulating film, though the structure is not especially shown. The nonvolatile memory cell has its threshold voltage heightened when electrons are injected into the floating gate or the like, and it has its threshold voltage lowered when the electrons are extracted from the floating gate or the like. Thus, the nonvolatile memory cell stores therein information corresponding to the magnitude of the threshold voltage relative to a word line voltage for data read. Under the controls of the card controller 42, the flash memory 43 is permitted to read out information stored in the nonvolatile memory cells, to store (for example, write) information in (into) the nonvolatile memory cells, and to initialize (for example, erase) the stored information of the nonvolatile memory cells.

The IC card microcomputer 44 includes a CPU, and a nonvolatile memory in which the operation programs of the CPU, control information to be utilized for verification, etc. are retained, though they are not especially shown. This IC card microcomputer 44 executes the verify process, the encrypt/decrypt processes, etc. in accordance with the operation programs. Adoptable as the IC card microcomputer 44 is one which performs contact interfacing or noncontact interfacing with the exterior by itself, or one which performs dual interfacing capable of both the contact interfacing and the noncontact interfacing. Here, the IC card microcomputer 44 of the noncontact interfacing type is adopted, and it executes, for example, data input/output, clock input and reset signal input through high-frequency communications which employ an antenna connected to terminals LA, LB. In the case of operating in noncontact interfacing fashion, the IC card microcomputer 44 is fed with electric power from the antenna connected to the antenna terminals (LA, LB).

The memory card 41 includes external terminals C1-C5, C6, C6A, C6B, and C7-C13 as external interface terminals. Here, an example capable of inputting/outputting 8-bit parallel data is mentioned. The terminal C1 is a data terminal DAT3, the terminals C7-C9 are data terminals DAT0-DAT2, the terminals C10-C13 are data terminals DAT4-DAT7, the terminal C2 is a command terminal CMD, the terminal C5 is a clock terminal CLK, a terminal C4 is a power source terminal VCC, the terminal C3 is a ground terminal VSS, the terminal C6 is a second ground terminal VSS2, and the terminals C6A, C6B are the antenna terminals LA, LB. The second ground terminal VSS2 is utilized for card insertion/extraction detection in the memory card 41.

Figure 12:
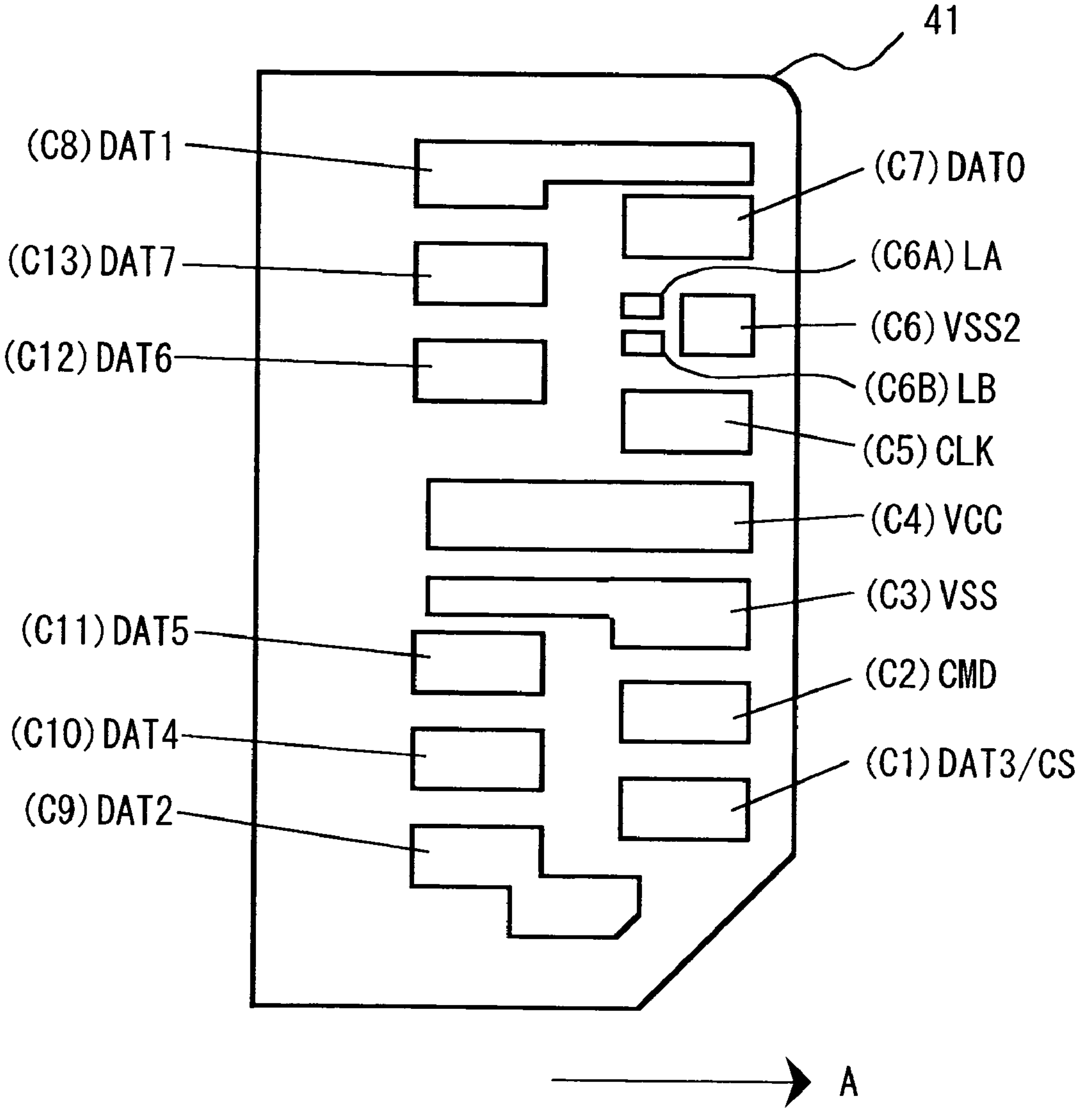
FIG. 12 is a plan view exemplifying the array of the external interface terminals of the memory card in FIG. 11.

Exemplified in FIG. 12 is the array of the external interface terminals of the memory card 41. The external interface terminals are formed in two rows in a direction crossing the insertion direction A of the memory card 41. The power source feeding terminals VSS, VCC are formed so as to extend over the two rows. The connector terminals of a card slot as correspond to the interface terminals of the first row lie frontward in the card insertion direction A, with respect to the connector terminals of the card slot as correspond to the interface terminals of the second row. In the case where the memory card originally includes the external interface terminal in the two rows, a time period till the cutoff of a power source can be easily made comparatively long by forming the power source feeding terminals VCC, VSS so as to extend from the first row over to the second row. Moreover, in the case where the memory card has the two terminal rows, the connector terminals of the card slot are originally in, at least, two rows, so that each of the power source feeding terminals VSS, VCC can be easily brought into touch with the corresponding connector terminal at two touch points, and the stability of power source feed can be easily coped with. In the examples of FIGS. 11 and 12, any insertion/extraction detecting terminal is not provided as a dedicated terminal. Here, the second ground terminal VSS2 is utilized for the insertion/extraction detection. More specifically, the power source terminal VCC and the second ground terminal VSS2 are connected through a high resistance. In a state where the memory card 1 is set in the card slot, the level of the second ground terminal VSS2 lies at a ground potential. When the memory card 41 is extracted from the card slot, the second ground terminal VSS2 is held at a high level until the power source terminal VCC has been separated from the corresponding power source connector of the card socket. Thus, the card controller 42 can recognize the extraction of the card 41. Upon detecting the extraction of the card 41, the card controller 42 executes an end process in the same manner as in the foregoing, before the cutoff of the power source.

Referring to FIG. 12, the antenna terminals LA, LB and the second ground terminal VSS2 are formed in regions obtained by dividing the region of the size of that interface terminal of the first row which is represented by the clock terminal CLK of the first row. The IC card microcomputer 44 of the memory card 41 is of the noncontact interfacing type as stated before. In this regard, in case of adopting the contact interfacing type which interfaces with the exterior through the card controller 42, the antenna terminals LA, LB and the second ground terminal VSS2 are replaced with a single second ground terminal VSS2. Accordingly, the terminal region of the size of the second ground terminal is utilized in such a memory card which is not adapted for the noncontact interfacing, whereby the memory card 41 adapted for the noncontact interfacing and including the two antenna connection terminals LA, LB can be fabricated. A place where the two antenna connection terminals LA, LB are formed, corresponds to the region where the second ground terminal is formed in the memory card which is not adapted for the noncontact interfacing and which does not have the data input/output function based on the antenna. In a case where the memory card 41 adapted for the noncontact interfacing has been inserted into a card slot for the memory card which is not adapted for the noncontact interfacing, the antenna connection terminals LA, LB are connected to a ground potential feeding connector terminal inside the card slot. Since a ground potential does not have any AC component, namely, any signal component, no problem is posed in the operation of the memory card 41. Even when a high-frequency component is superposed on the ground potential by the antenna connection terminals LA, LB contrariwise, this potential does not fluctuate greatly. Therefore, in the case where the memory card 41 in FIG. 11 has been inserted into the card slot for the memory card which is not adapted for the noncontact interfacing, any inconvenience is not incurred by the connection of the signaling connector terminal of the card slot side with the antenna connection terminals LA, LB. On the other hand, in a case where the memory card which is not adapted for the noncontact interfacing has been inserted into the card slot for the noncontact interfacing type, the antenna connecting connector terminals of the card slot is connected to the grounding external terminal of the memory card which is not adapted for the noncontact interfacing, and the antenna is short-circuited. However, an electromotive force based on the antenna is small, and the output impedance of the antenna is high, any inconvenience is not incurred by the short-circuit of the antenna. As shown in FIG. 11, the antenna connection terminals LA, LB are connected to the IC card microcomputer 44 through capacitance elements Cac for AC coupling. Thus, a DC component is reliably restrained from being superposed on the ground potential from the antenna connection terminals LA, LB and through the ground potential connector terminal of the card slot for the memory card which is not adapted for the noncontact interfacing, and the transmission of the signal component from the antenna is reliably prevented from being hindered.

Figure 13:
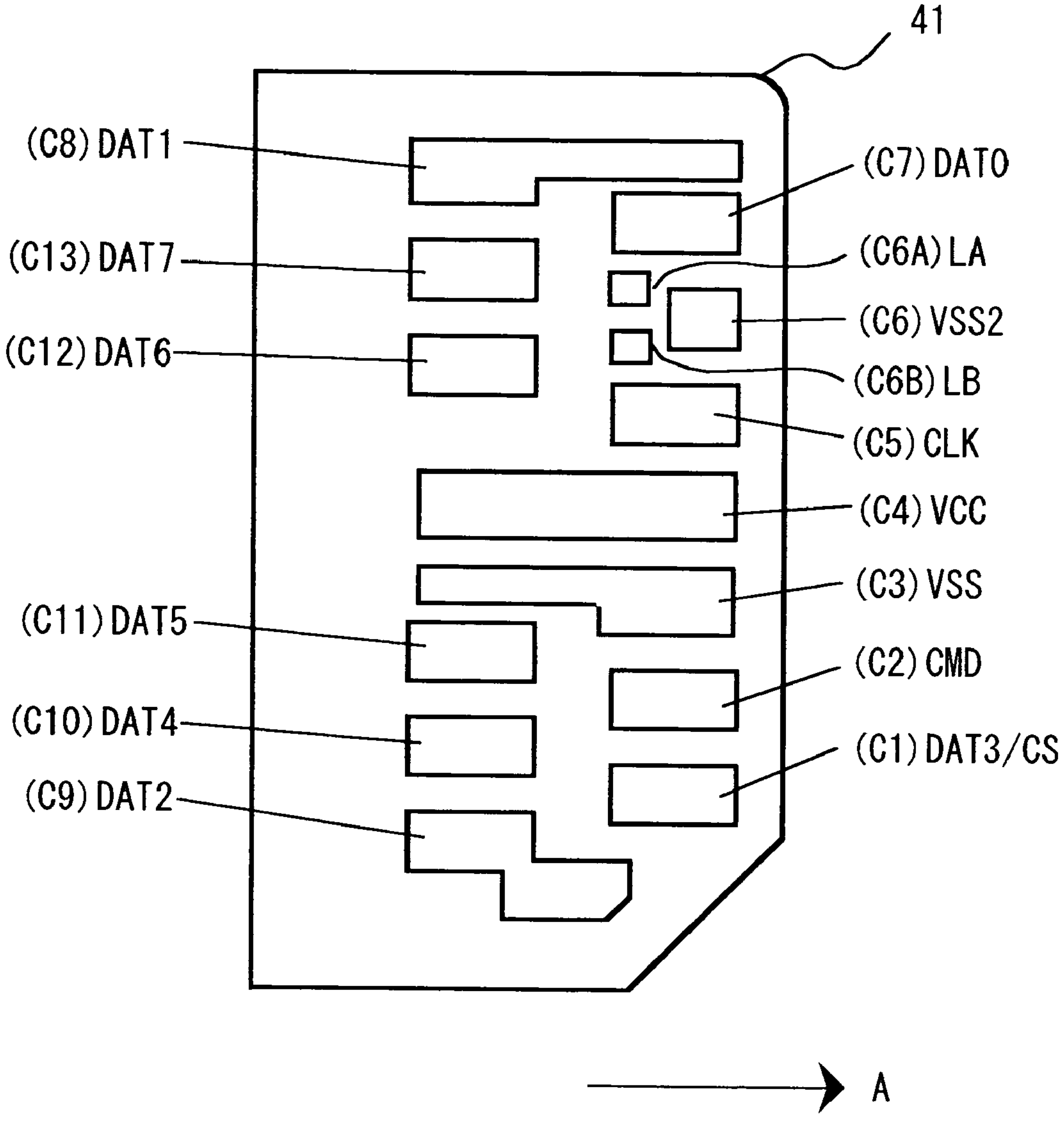
FIG. 13 is a plan view showing the array of external interface terminals as differs from the array in FIG. 12 in the point that antenna terminals are enlarged.
Figure 14:
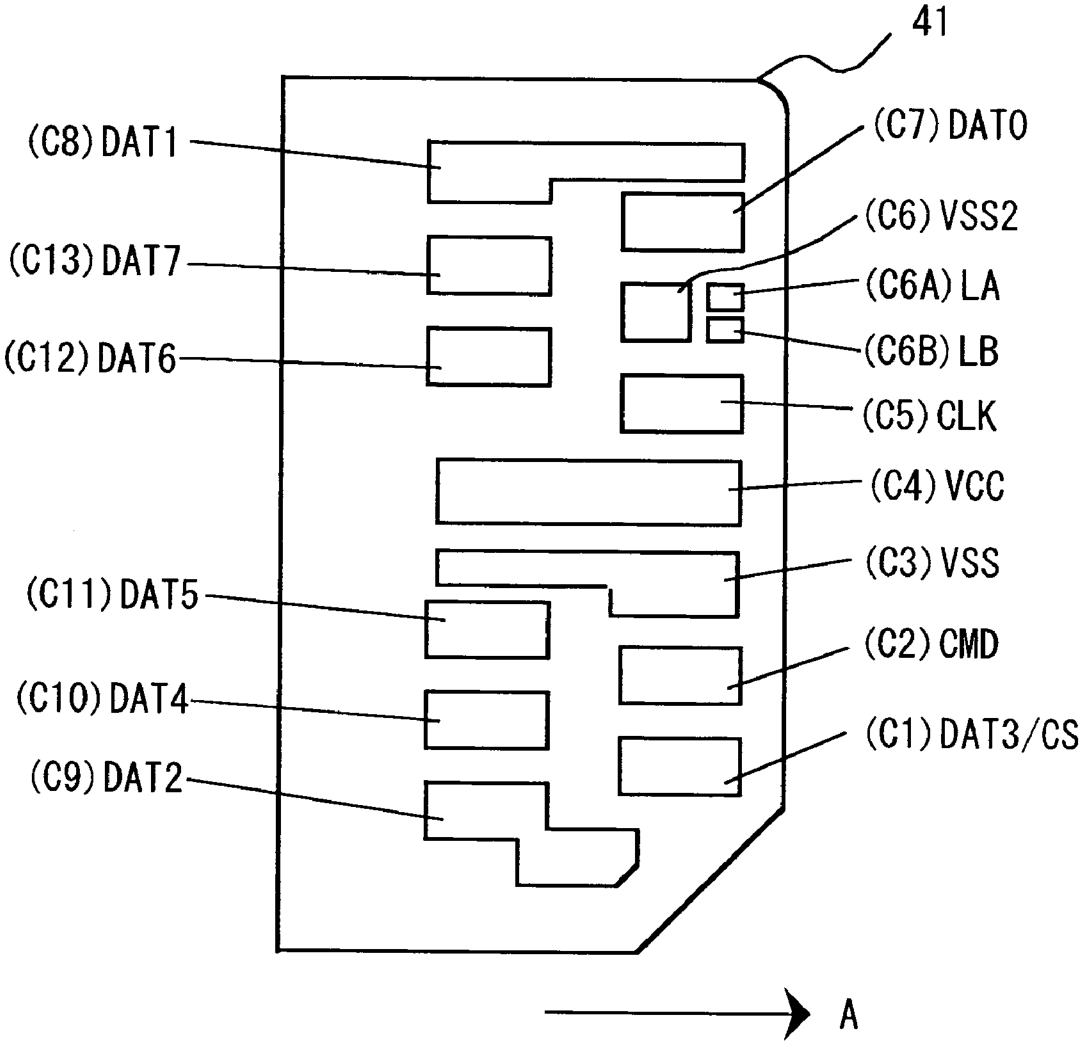
FIG. 14 is a plan view exemplifying the array of external interface terminals as differs from the array in FIG. 12 in the point that the front and rear positions of antenna terminals and a second ground terminal are reversed.
Figure 15:
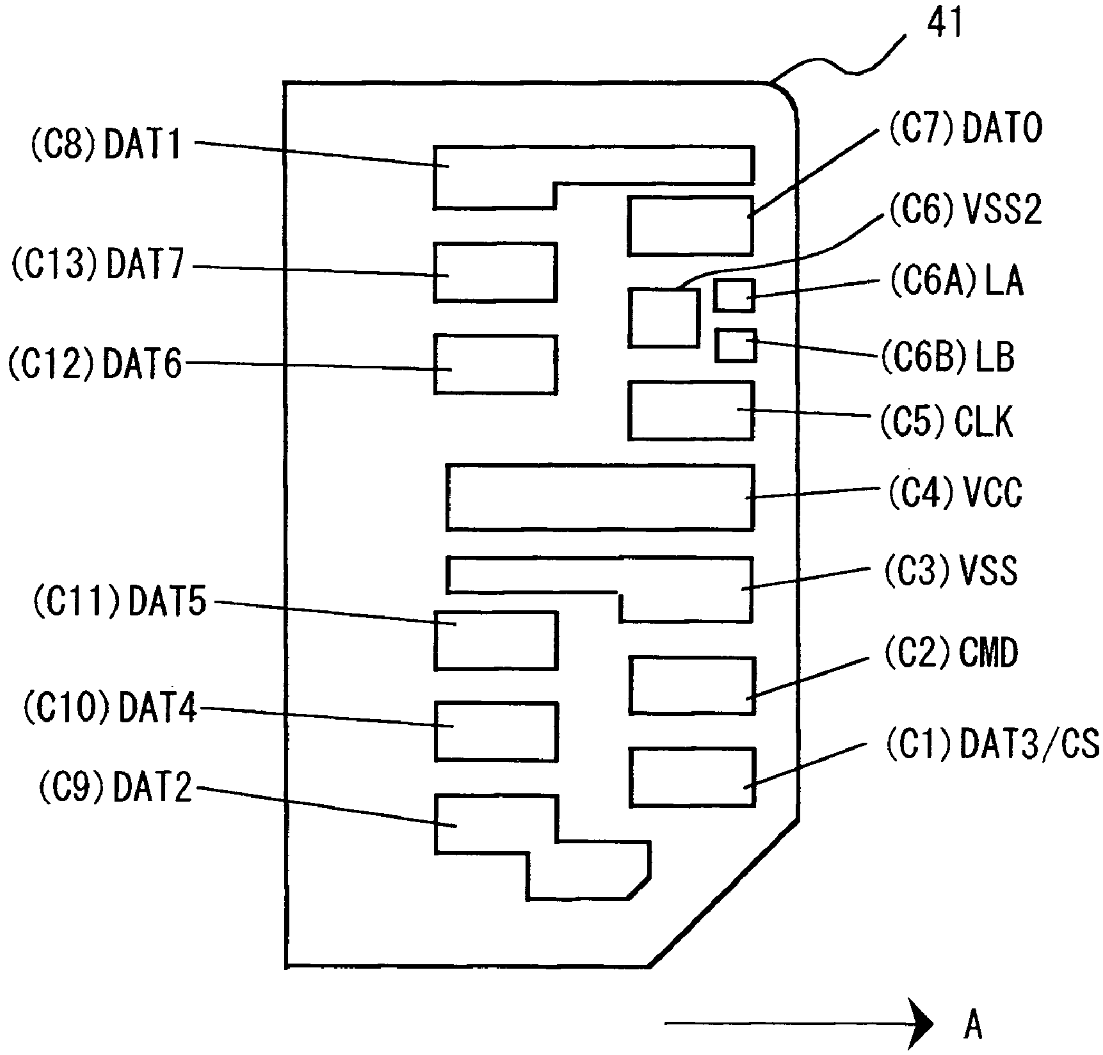
FIG. 15 is a plan view exemplifying the array of external interface terminals as differs from the array in FIG. 13 in the point that the front and rear positions of antenna terminals and a second ground terminal are reversed.
Figure 16:
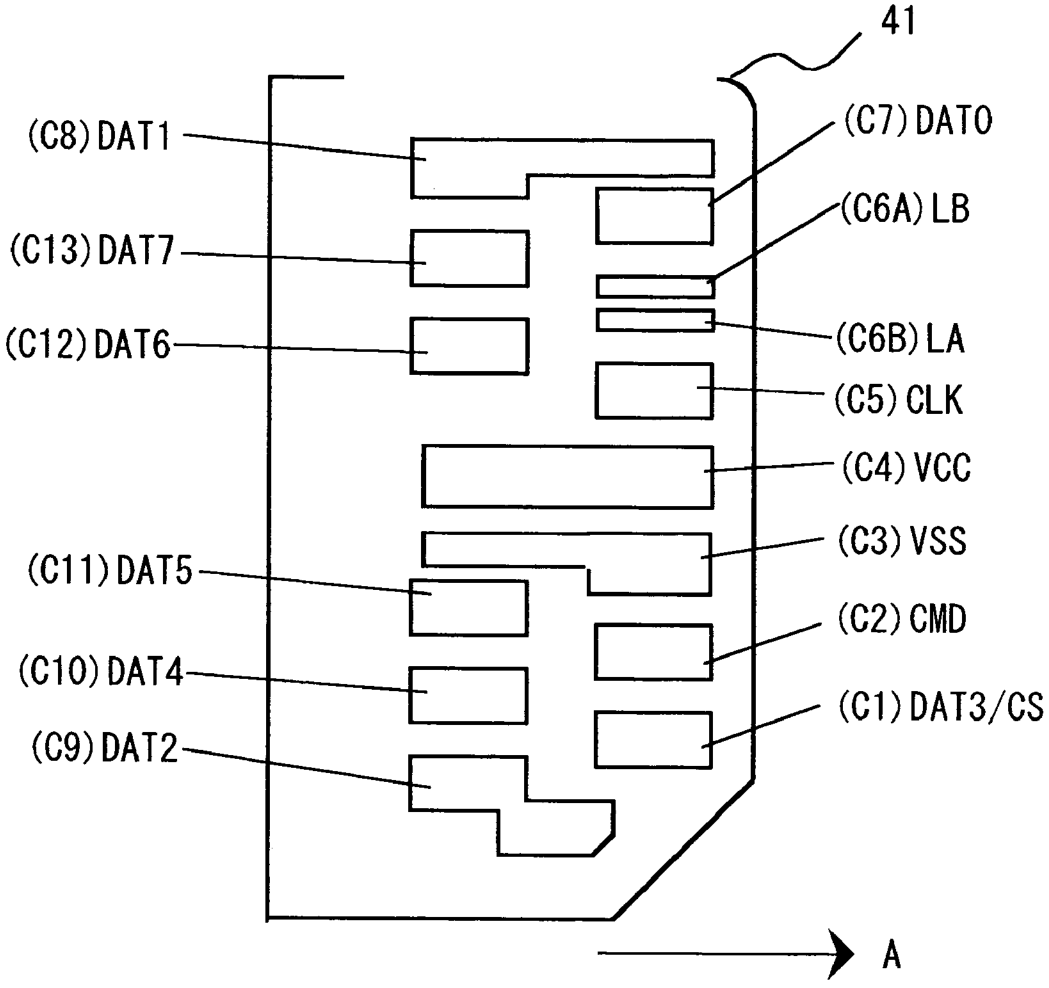
FIG. 16 is a plan view exemplifying the array of external interface terminals as differs from the array in FIG. 12 in the point that a second ground terminal is abolished, and that antenna terminals are lengthened correspondingly.

The arrangement of the external interface terminals of the memory card 41 as shown in FIG. 13 differs from the arrangement in FIG. 12 in the point that the antenna terminals LA, LB are enlarged. The arrangement of the external interface terminals of the memory card 41 as shown in FIG. 14 differs from the arrangement in FIG. 12 in the point that the front and rear positions of the antenna terminals LA, LB and the second ground terminal VSS2 are reversed. The arrangement of the external interface terminals of the memory card 41 as shown in FIG. 15 differs from the arrangement in FIG. 13 in the point that the front and rear positions of the antenna terminals LA, LB and the second ground terminal VSS2 are reversed. The arrangement of the external interface terminals of the memory card 41 as shown in FIG. 16 differs from the arrangement in FIG. 12 in the point that the second ground terminal VSS2 is abolished, and that the antenna terminals LA, LB are lengthened correspondingly.

Although the invention made by the inventor has thus far been concretely described in conjunction with the embodiments, it is needless to say that the invention is not restricted to the foregoing embodiments, but that it is variously alterable within a scope not departing from the purport thereof.

By way of example, the definitions of the erase and the write may well be reverse to the foregoing ones. The stored information of each nonvolatile memory cell is not restricted to two-valued data, but it may well be four or more valued data. The functions and designations of the external interface terminals of the memory card are appropriately alterable without being restricted to those described above. The memory card may well include any data processor other than the IC card microcomputer. The instruction of the end process for the flash memory is not restricted to the case of using the reset signal, but any other signal or command may well be used. The processing circuits of the memory card are not restricted to the interface control circuit and the flash memory. The flash memory is not restricted to one which is dedicated to the information storage, but it may well be one which constitutes a programmable logic array. Besides, the end process is not restricted to a write-back process, a write completion process for management information, or the completion of a midway write operation, but it may well be any other process. Further, the decoupling capacitors need not always be disposed.

The invention is extensively applicable to semiconductor devices each of which includes a nonvolatile memory capable of rewriting stored information and a control circuit therefor, and each of which is fed with an operating power source from the exterior.

What is claimed is:

1. A semiconductor device which comprises external interface terminals and processing circuits, and which is fed with an operating power source when detachably set in a host equipment, wherein:

said external interface terminals include power source feeding terminals, an extraction detecting terminal, and other terminals;

said power source feeding terminals are long enough to keep touching corresponding terminals of the host equipment for, at least, a predetermined time period after separation of said extraction detecting terminal from a corresponding terminal of the host equipment;

said power source feeding terminals are formed to be longer in an extraction direction than said extraction detecting terminal; and said power source feeding terminals are also made longer than said extraction detecting terminal on an insertion side of the extraction detecting terminal, and a length by which said power source feeding terminals protrude in an insertion direction beyond said extraction detecting terminal is smaller than a length by which they protrude in the extraction direction.

2. A semiconductor device which comprises external interface terminals and processing circuits, and which is fed with an operating power source when detachably set in a host equipment, wherein:

said external interface terminals include power source feeding terminals, an extraction detecting terminal, and other terminals;

said power source feeding terminals are long enough to keep touching corresponding terminals of the host equipment for, at least, a predetermined time period after separation of said extraction detecting terminal from a corresponding terminal of the host equipment;

said power source feeding terminals are formed to be longer in an extraction direction than said extraction detecting terminal; and when said semiconductor device has been set in the host equipment, each of said power source feeding terminals touches the corresponding terminal of the host equipment at two points along the extraction direction.

3. A semiconductor device which comprises external interface terminals and processing circuits, and which is fed with an operating power source when detachably set in a host equipment, wherein:

said external interface terminals include power source feeding terminals, an extraction detecting terminal, and other terminals; and said power source feeding terminals are long enough to touch corresponding terminals of the host equipment for, at least, 1.0 millisecond after separation of said extraction detecting terminal from a corresponding terminal of the host equipment, with respect to an extraction speed of 2.5 meters/second;

said power source feeding terminals are formed to be longer in an extraction direction than said extraction detecting terminal; and said power source feeding terminals are also made longer than said extraction detecting terminal on an insertion side of the extraction detecting terminal, and a length by which said power source feeding terminals protrude in an insertion direction beyond said extraction detecting terminal is smaller than a length by which they protrude in the extraction direction.

4. A semiconductor device which comprises external interface terminals and processing circuits, and which is fed with an operating power source when detachably set in a host equipment, wherein:

said external interface terminals include power source feeding terminals, an extraction detecting terminal, and other terminals;

said power source feeding terminals are long enough to touch corresponding terminals of the host equipment for, at least, 1.0 millisecond after separation of said extraction detecting terminal from a corresponding terminal of the host equipment, with respect to an extraction speed of 2.5 meters/second; and when said semiconductor device has been set in the host equipment, each of said power source feeding terminals touches the corresponding terminal of the host equipment at two points along an extraction direction.

* * * * *